US006974525B2

(12) United States Patent
Emesh et al.

(10) Patent No.: US 6,974,525 B2
(45) Date of Patent: Dec. 13, 2005

(54) METHOD AND APPARATUS FOR ELECTROCHEMICAL PLANARIZATION OF A WORKPIECE

(75) Inventors: Ismail Emesh, Gilbert, AZ (US); Saket Chadda, Chandler, AZ (US); Nikolay N. Korovin, Phoenix, AZ (US); Brian L. Mueller, Chandler, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 10/709,598

(22) Filed: May 17, 2004

(65) Prior Publication Data

US 2004/0195110 A1  Oct. 7, 2004

Related U.S. Application Data

(63) Continuation of application No. 09/781,593, filed on Feb. 12, 2001, now Pat. No. 6,736,952.

(51) Int. Cl.[7] ............................................. C25F 3/02
(52) U.S. Cl. ................. 204/212; 204/217; 204/224 M; 205/663
(58) Field of Search ............................... 205/641, 662, 205/663; 204/199, 212, 217, 224 M; 451/36, 451/41, 287, 288

(56) References Cited

U.S. PATENT DOCUMENTS

| 3,849,272 A | 11/1974 | Zubak |
| 5,256,565 A | 10/1993 | Bernhardt et al. |
| 5,265,378 A | 11/1993 | Rostoker |
| 5,567,300 A | 10/1996 | Datta et al. |
| 5,575,706 A | 11/1996 | Tsai et al. |
| 5,605,488 A | 2/1997 | Ohashi et al. |
| 5,853,317 A | 12/1998 | Yamamoto |
| 5,863,412 A | 1/1999 | Ichinose et al. |
| 5,882,251 A | 3/1999 | Berman et al. |
| 5,911,619 A | 6/1999 | Uzoh et al. |
| 5,934,974 A | 8/1999 | Tzeng |
| 5,934,977 A | 8/1999 | Marmillion et al. |
| 5,993,637 A | 11/1999 | Hisamatsu et al. |
| 6,017,437 A | 1/2000 | Ting et al. |
| 6,056,869 A | 5/2000 | Uzoh |
| 6,077,412 A | 6/2000 | Ting et al. |
| 6,106,662 A | 8/2000 | Bibby, Jr. et al. |
| 6,121,144 A | 9/2000 | Marcyk et al. |
| 6,176,992 B1 | 1/2001 | Talieh |

(Continued)

FOREIGN PATENT DOCUMENTS

| GB | 2069531 | 8/1981 |
| WO | WO 00/26443 | 5/2000 |

Primary Examiner—Roy King
Assistant Examiner—William T. Leader
(74) Attorney, Agent, or Firm—Snell & Wilmer L.L.P.

(57) ABSTRACT

An electrochemical planarization apparatus for planarizing a metallized surface on a workpiece includes a polishing pad and a platen. The platen is formed of conductive material, is disposed proximate to the polishing pad and is configured to have a negative charge during at least a portion of a planarization process. At least one electrical conductor is positioned within the platen. The electrical conductor has a first end connected to a power source. A workpiece carrier is configured to carry a workpiece and press the workpiece against the polishing pad. The power source applies a positive charge to the workpiece via the electrical conductor so that an electric potential difference between the metallized surface of the workpiece and the platen is created to remove at least a portion of the metallized surface from the workpiece.

10 Claims, 8 Drawing Sheets

U.S. PATENT DOCUMENTS 6,368,190 B1    4/2002   Easter et al.
6,379,223 B1    4/2002   Sun et al.
6,464,855 B1    10/2002  Chadda et al.
6,482,307 B2 *  11/2002  Ashjaee et al. ............. 205/103

* cited by examiner

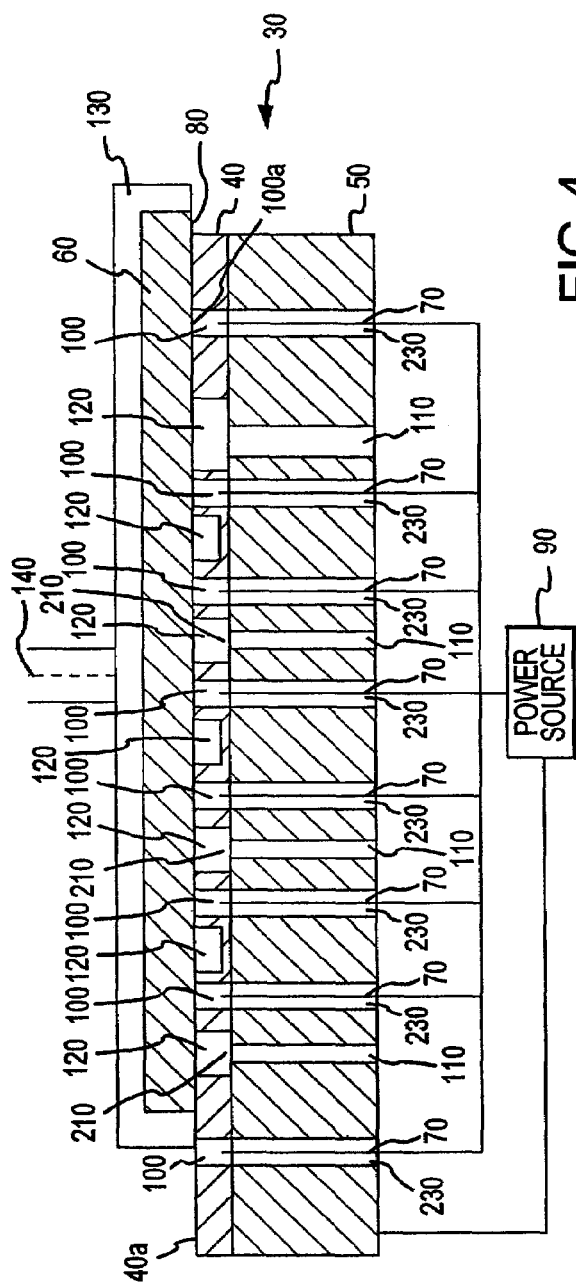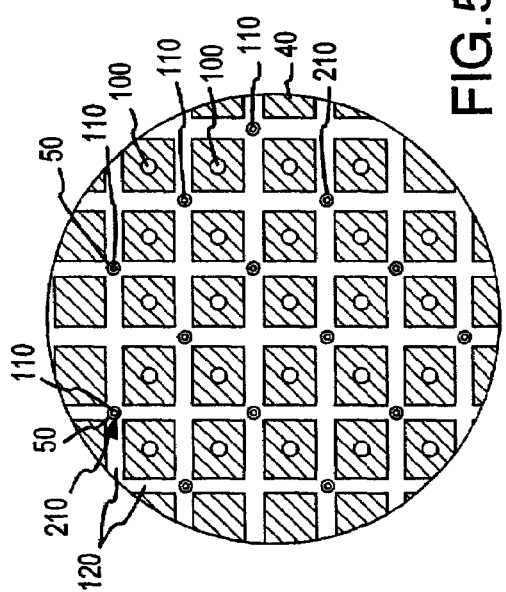

METHOD AND APPARATUS FOR ELECTROCHEMICAL PLANARIZATION OF A WORKPIECE

CROSS REFERENCE TO RELATED APPLICATIONS

This patent application claims the benefit of and is a continuation of application Ser. No. 09/781,593 filed in the United States Patent and Trademark Office on Feb. 12, 2001 now U.S. Pat. No. 6,736,952.

FIELD OF INVENTION

The present invention relates, generally, to systems for polishing or planarizing workpieces, such as semiconductor wafers. More particularly, it relates to an apparatus and method for electrochemical planarization of a wafer having a metallized surface.

BACKGROUND OF INVENTION

The production of integrated circuits begins with the creation of high-quality semiconductor wafers. During the wafer fabrication process, the wafers may undergo multiple masking, etching, and dielectric and conductor deposition processes. In addition, metallization, which generally refers to the materials, methods and processes of wiring together or interconnecting the component parts of an integrated circuit located on the surface of a wafer, is critical to the operation of a semiconductor device. Typically, the "wiring" of an integrated circuit involves etching trenches and "vias" in a planar dielectric (insulator) layer and filling the trenches and vias with a metal.

In the past, aluminum was used extensively as a metallization material in semiconductor fabrication due to the leakage and adhesion problems experienced with the use of gold, as well as the high contact resistance which copper experienced with silicon. Other metallization materials have included Ni, Ta, Ti, W, Ag, Cu/Al, TaN, TiN, CoWP, NiP and CoP. Over time, the semiconductor industry has slowly been moving to the use of copper for metallization due to the alloying and electromigration problems that are seen with aluminum. When copper is used as the trench and via filling material, typically a barrier layer of another material is first deposited to line the trenches and vias to prevent the migration of copper into the dielectric layer. Barrier metals may be W, Ti, TiN, Ta, TaN, various alloys, and other refractory nitrides, which may be deposited by CVD, PFD, or electrolytic plating. To achieve high quality filling of the trenches and vias, extra metal is often deposited over areas of the wafer above and outside the trenches and vias. After filling, planarization is typically conducted to remove the extra metal down to the dielectric surface. Planarization leaves the trenches and vias filled and results in a flat, polished surface.

Because of the high degree of precision required in the production of integrated circuits, an extremely flat surface is generally needed on at least one side of the semiconductor wafer to optimize the fabrication process, as well as to ensure proper accuracy and performance of the microelectronic structures created on the wafer surface. As the size of the integrated circuits continues to decrease and the density of microstructures on an integrated circuit increases, the need for precise wafer surfaces becomes more important. Therefore, between each processing step, it is usually necessary to polish or planarize the surface of the wafer to obtain the flattest surface possible.

Chemical mechanical planarization (CMP) is a technique conventionally used for planarization of semiconductor wafers. For a discussion of chemical mechanical planarization (CMP) processes and apparatus, see, for example, Arai et al., U.S. Pat. No. 4,805,348, issued February 1989; Arai et al., U.S. Pat. No. 5,099,614, issued March 1992; Karlsrud et al., U.S. Pat. No. 5,329,732, issued July 1994; Karlsrud, U.S. Pat. No. 5,498,196, issued March 1996; and Karlsrud et al., U.S. Pat. No. 5,498,199, issued March 1996.

Typically, a CMP machine includes a wafer carrier configured to hold, rotate, and transport a wafer during the process of polishing or planarizing the wafer. During a planarization operation, a pressure applying element (e.g., a rigid plate, a bladder assembly, or the like) that may be integral to the wafer carrier, applies pressure such that the wafer engages a polishing surface with a desired amount of force. The carrier and the polishing surface are rotated, typically at different rotational velocities, to cause relative lateral motion between the polishing surface and the wafer and to promote uniform planarization.

In general, the polishing surface comprises a horizontal polishing pad that has an exposed abrasive surface of, for example, cerium oxide, aluminum oxide, fumed/precipitated silica or other particulate abrasives. Polishing pads can be formed of various materials, as is known in the art, and are available commercially. Typically, the polishing pad may be blown polyurethane, such as the IC and GS series of polishing pads available from Rodel Products Corporation in Scottsdale, Ariz. The hardness and density of the polishing pad depend on the material that is to be polished. An abrasive slurry may also be applied to the polishing surface. The abrasive slurry acts to chemically weaken the molecular bonds at the wafer surface so that the mechanical action of the polishing pad can remove the undesired material from the wafer surface.

While CMP tends to work very well for planarization if the correct slurry and process parameters are used, it may leave stresses in the worked workpiece, leading to subsequent cracking and shorting between metal layers. In addition, the semiconductor industry is increasingly using low k dielectrics, which tend to be fragile materials. CMP may result in shearing or crushing of these fragile layers. CMP also has a tendency to cause dishing in the center of wide metal features, such as trenches and vias, oxide erosion between metal features, and oxide loss of the dielectric.

Electrochemical planarization is an attractive alternative to CMP because it does not impart significant mechanical stresses to the workpiece and, consequently, does not significantly reduce the integrity of the low k dielectric devices. Further, electrochemical planarization is less likely to cause dishing, oxide erosion and oxide loss of the dielectric layer.

Electrochemical planarization is based on electroetching and electrochemical machining, that is, the removal of a thin layer of metal from a substrate by the combination of an electrochemical solution and electricity. FIG. 1 shows a conventional prior art electroetching cell. A tank 2 holds a liquid electrolyte 4, such as an aqueous solution of a salt. Two electrodes, an anode 6 and a cathode 8, are wired to a current source, such as a battery 10. When the apparatus is electrified, metal atoms in the anode 6 are ionized by the electricity and go into the solution as ions. Depending on the chemistry of the metals and salt, the metal ions from anode 6 either plate the cathode 8, fall out as precipitate, or remain in solution.

When used for planarization of metal films on semiconductior wafers, conventional electrochemical planarization presents the disadvantage that the metal may not be selectively removed from the wafer. While existing electrochemical planarization techniques are known to "smooth" a metal layer, they are limited by topography dimensions and do not achieve true planarization. FIG. 2 shows a dielectric layer 12 having trenches, or vias, and having a barrier metal layer 20 thereon. A metal layer 14 is deposited on the wafer over the barrier layer, filling the trenches. After being deposited on barrier layer 20, metal layer 14 may not be completely flat but, rather, may have areas of high topography 16 and low topography 18. With conventional electrochemical planarization, when the areas of high topography and low topography are of large dimension, selectivity of etching is reduced and the metal layer is removed uniformly, so that the areas of high topography and low topography remain. In addition, chemical saturation may act to inhibit selective etching in areas of small dimension topography. At the start of a conventional electrochemical planarization process, metal ions dissociate from the metal layer and enter the electrolytic solution, saturating the electrolytic solution close to the metal layer. When current is applied, a rapid increase of metal ions into the solution creates an "anode film." As the anode film becomes saturated with metal ions, the planarization process slows down or stops in response to the increase in the anode film metal ion saturation level. Thus, with conventional electrochemical planarization, uniform planarization is not achieved.

For uniform planarization, "step-height reduction" is desired, that is, the selective removal of the metal layer at the high topography areas, followed by uniform removal of the metal layer, both locally and globally. Step-height reduction should result in metal remaining only in the trenches and vias with a flat surface therein, as illustrated in FIG. 3.

Accordingly, there exists a need for an electrochemical planarization method and apparatus which accomplishes improved step-height reduction of metal layers on substrates, followed by uniform planarization of the metal layer.

SUMMARY OF INVENTION

These and other aspects of the present invention will become more apparent to those skilled in the art from the following non-limiting detailed description of preferred embodiments of the invention taken with reference to the accompanying figures.

In accordance with an exemplary embodiment of the present invention, an electrochemical planarization apparatus for planarizing a metallized surface on a workpiece includes a polishing pad and a platen. The platen is formed of conductive material, is disposed proximate to the polishing pad, and is configured to have a negative charge during at least a portion of a planarization process. A workpiece carrier is configured to carry a workpiece and press the workpiece against the polishing pad. At least one electrical conductor is positioned within the platen and has a first end connected to a power source. The power source applies a positive charge to the workpiece via the electrical conductor so that an electric potential difference between the metallized surface of the workpiece and the platen is created to remove at least a portion of the metallized surface from the workpiece.

In accordance with another embodiment of the present invention, the electrochemical planarization apparatus includes a solution application mechanism configured to supply a first electrolytic planarizing solution to a polishing surface of the polishing pad.

In accordance with a further embodiment of the present invention, the electrolytic planarizing solution includes a film forming agent for facilitating the formation of a passivation layer on the metallized surface of the workpiece.

In accordance with yet another embodiment of the present invention, the electrochemical planarization apparatus includes at least a first group and a second group of electrical conductors. A first current is supplied to the first group and a second current is supplied to the second group.

In accordance with yet a further embodiment of the present invention, the electrochemical planarization apparatus includes an endpoint detection apparatus configured to detect an endpoint of a planarization process of a workpiece.

In accordance with another exemplary embodiment of the present invention, a method of planarizing a metallized surface on a workpiece includes: providing a polishing pad; providing a platen formed of a conductive material and disposed proximate to the polishing pad; providing a plurality of electrical conductors positioned within the platen; pressing the workpiece against the polishing pad while causing relative motion between the workpiece and the electrical conductors; and establishing an electric potential difference between the metallized surface of the workpiece and the platen.

BRIEF DESCRIPTION OF DRAWINGS

Exemplary embodiments of the present invention will hereafter be described in conjunction with the appended drawing figures, wherein like designations denote like elements, and:

FIG. 4 is a cross-sectional view of a polishing pad and platen in accordance with an exemplary embodiment of the present invention;

FIG. 5 is a top view of a polishing pad and platen in accordance with an embodiment of the present invention;

Figure 1:
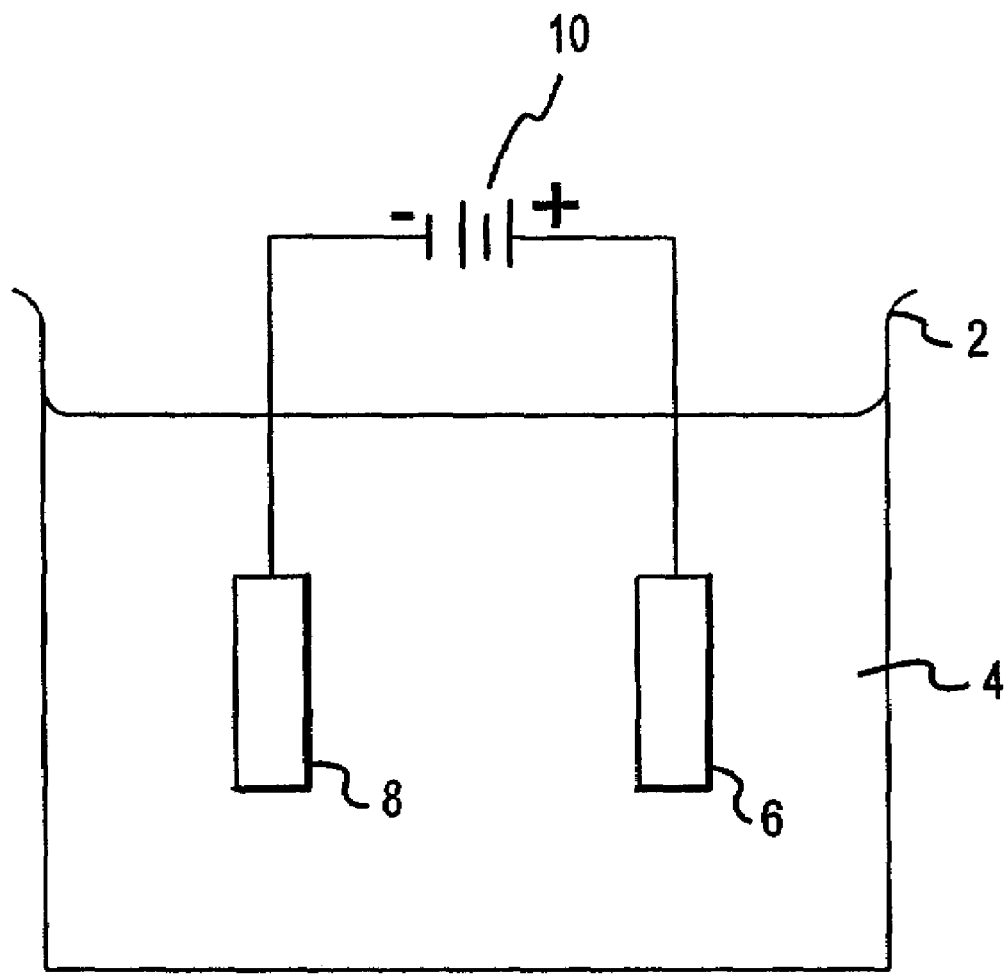
FIG. 1 is a schematic illustration of an electroetching cell of the prior art.
Figure 2:
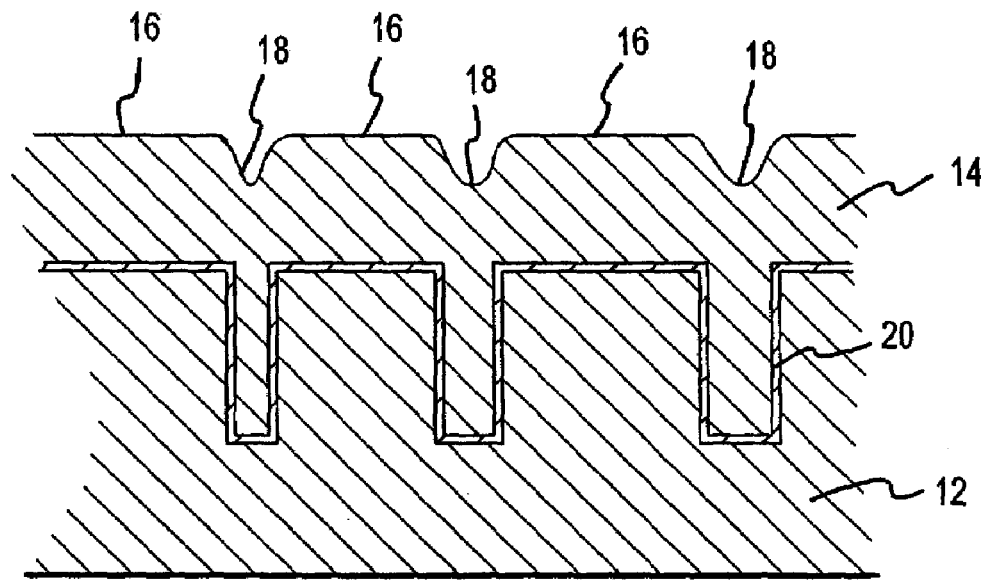
FIG. 2 is a cross-sectional view of a substrate with a metal layer.
Figure 3:
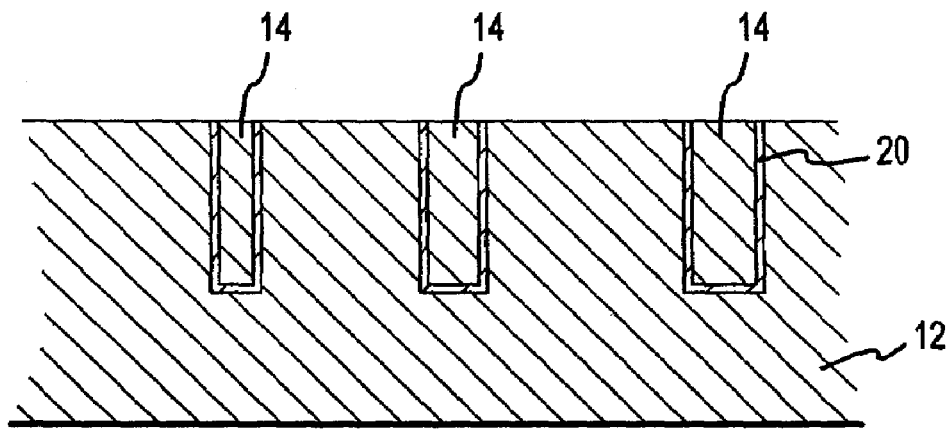
FIG. 3 is a cross-sectional view of a substrate with metal-filled trenches.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

A schematic representation of an exemplary embodiment of an electrochemical planarization (ECP) apparatus 30 of the present invention is illustrated in FIG. 4. The ECP apparatus 30 may use chemical mechanical planarization (CMP) in addition to electrochemical etching to planarize the metallized surfaces of workpieces. To effect electrochemical etching, ECP apparatus 30 utilizes an insulative polishing pad 40 supported by a platen 50. A wafer 60 with a metallized surface 80 may be urged against polishing pad 40 by a wafer carrier assembly 130. Polishing pad 40 may be of the same diameter of wafer 60 or may have a larger or smaller diameter than wafer 60. Platen 50 may be fabricated from a conductive material, such as copper, tantalum, gold or platinum or may be formed of an inexpensive material, such as aluminum or titanium, coated with a conductive material such as platinum, gold or titanium. Platen 50 is connected to a power source 90 which is configured to establish an electric potential difference between platen 50 and metallized surface 80, as described in more detail below. Platen 50 may be connected to a driver or motor assembly (not shown) that is operative to rotate platen 50 and polishing pad 40 about a vertical axis. It will be appreciated, however, that the driver or motor assembly may be operative to move platen 50 and polishing pad 40 in an orbital, linear or oscillatory pattern or any combination thereof.

Platen 50 may have one or two, but preferably a plurality of, channels 110 for the transportation of an electrolytic planarizing solution to a surface 40a of polishing pad 40 from a manifold apparatus (not shown) or any suitable fluid distribution system. Alternatively, it will be appreciated that the electrolytic planarizing solution may be deposited directly on or through surface 40a of polishing pad by a conduit or any suitable application mechanism.

Electrolytic planarizing solutions containing electrolytes suitable for use in the present invention are well known in the art. The electrolytic planarizing solution may include concentrated mineral acids such as phosphoric acid, sulfuric acid, chromic acid, perchloric acid, or mixtures thereof. Metaphosphoric acid, pyrophosphoric acid, polyphosphoric acid, and ammonium phosphate may also be used. Salts may be used in addition to or in place of acids in the solution, such as alkali and alkali earth metal salts of halides, carboxylates, and nitrates. Transition metal salts such as copper sulfate, copper nitrate and the like may also be included. In addition to these compounds, the electrolytic planarizing solution may also include a conventional CMP slurry to facilitate chemical mechanical planarization.

The electrolytic planarizing solution may also include a film forming agent which includes any compound or mixture of compounds that facilitates the formation of a passivation film of metal oxides and dissolution-inhibiting layers on the metallized surface of wafer 60. The passivation film reduces, and preferably eliminates, wet etching of the low topography areas of the metallized surface 80 of wafer 60 until the low topography areas come in contact with polishing pad 40. When these low topography areas come in contact with polishing pad 40 and electrical conductors 70, described below, the passivation film is removed and electrochemical etching may proceed. Thus, the passivation film enhances uniform planarization of wafer 60. Suitable film forming agents may be formed of nitrogen-containing cyclic compounds such as proline, adedine, mercaptonitriles, imidazole, triazole, benzotriasole, benzimidazole and benzothiazole and their derivatives with hydroxy, amino, imino, carboxy, mercapto, nitro and alkyl substituted groups, as well as urea, thiourea and others. Other suitable film forming agents may include benzofuroxan, benzothiadiazole, phenylenediamine, catechol, amionpheno, mercaptobenzthiazole, mercaptobenztriazole, mercaptobenoxazole, melamine and thiadiazole.

The electrolytic planarizing solution may also include oxidizers to facilitate planarization. Oxidizers may be used in the electrolytic planarizing solution to tailor the oxidation-reduction potential of the solution for a desired application. Oxidizers may also be used to control the electric current density and to reduce the formation of bubbles which may cause non-uniform electropolishing. Suitable oxidizers may include hydrogen peroxide, ferricyanide, bisulfate, monopersulfate, periodate, perchlorate, and other "per" compounds and anions, nitrate, hypochorite, hydroxylamine (HDA) and hydroxylamine derivatives, including chloride, sulfate, nitrate and other salt derivatives.

Complexing agents also may be used in the electrolytic planarization solution. During the planarization of a metal layer, organic and metal ions and metal oxide may rapidly form on the etched metal layer, repassivating the metal layer. As described in more detail below, polishing pad 40 may be urged against wafer 60 with a relatively low force, preferably no more than 1 psi. This low force may not be sufficient to remove the repassivation layer so that electrochemical planarization may proceed. Complexing agents may be used to achieve acceptable planarization rates by inhibiting the formation of undesirable repassivation layers. Complexing agents also may prevent viscous gels formed of metal ion-saturated electrolytic planarizing solution from collecting on the wafer and the electrical conductors.

Suitable complexing agents include amines or compounds possessing amine-like characteristics. In one embodiment of the invention in which the metallized layer is formed of copper, the complexing agent may include glycine. Glycine forms a chelate complex with copper ions that inhibits the formation of copper oxide repassivation films. Other suitable complexing agents may include ethylenediaminetetracetic acid and salts thereof, ethylene diamine, 1,8-diazabicyclo [5.4.0] undec 7-ene, 1,4-diazabicyclo [2.2.2] octane, ethylene glycol, crown ethers, catechol and gallol. Other useful complexing agents may be formed of acids, such as citric, lactic, malonic, tartaric, succinic, malic, acetic and oxalic acid, as well as amino acids, sulfamic and amino sulfuric acids, phosphoric acids, phosphonic acids, 2-quinoline carboxylic acid, and their salts. Fluoride and fluoride-containing compounds that are capable of producing active fluoride, such as flouboric acid, fluotitanic acid, hydrofluoric acid, fluosilicic acid and the like, and their salts, may also be used.

Additives which modify and control the viscosity of the electrolytic planarizing solution may also be included. Such additives may optimize viscosity to reduce turbulent flow of the electrolytic planarizing solution which may result in non-uniform electrochemical etching. Such additives may include glycerol, glycerin, alcohols, such as methanol, ethanol, propanol and the like, and ester and ether solvents, such as ethylene glycol monobutylether. Polymeric additives such as polyacrylic acid, propylene oxide, polyethylene oxide and polyvinylalcohol may also be used if they are soluble in the highly ionic electrolytic planarizing solution.

Surfactants may also be a useful component of the electrolytic planarizing solution. Sufactants may be used to facilitate wetting of the metal layer, the passivation film formed by the film forming agent, and the electrical conductors to prevent bubbles from adhering to those surfaces.

Polishing pad 40 may be formed of a polymeric material, a polymetric/inorganic composite "fixed abrasive" material or a ceramic insulator material. The hardness and density of polishing pad 40 are selected based on the type of material to be planarized. Blown polyurethane pads, such as the IC and GS series of pads available from Rodel Products Corporation of Scottsdale, Ariz., may be advantageously utilized by the ECP apparatus, although it will be appreciated that any suitable polishing pad may be used. Polishing pad 40 has a thickness which may range from approximately 200 angstroms to approximately 3 mm. However, the current density and, accordingly, the removal rate of the metallized surface 80 of wafer 60, is inversely proportional to the distance between platen 50, which acts as a cathode when an electric potential is applied, and the metallized surface 80, which acts as an anode.

Figure 9:
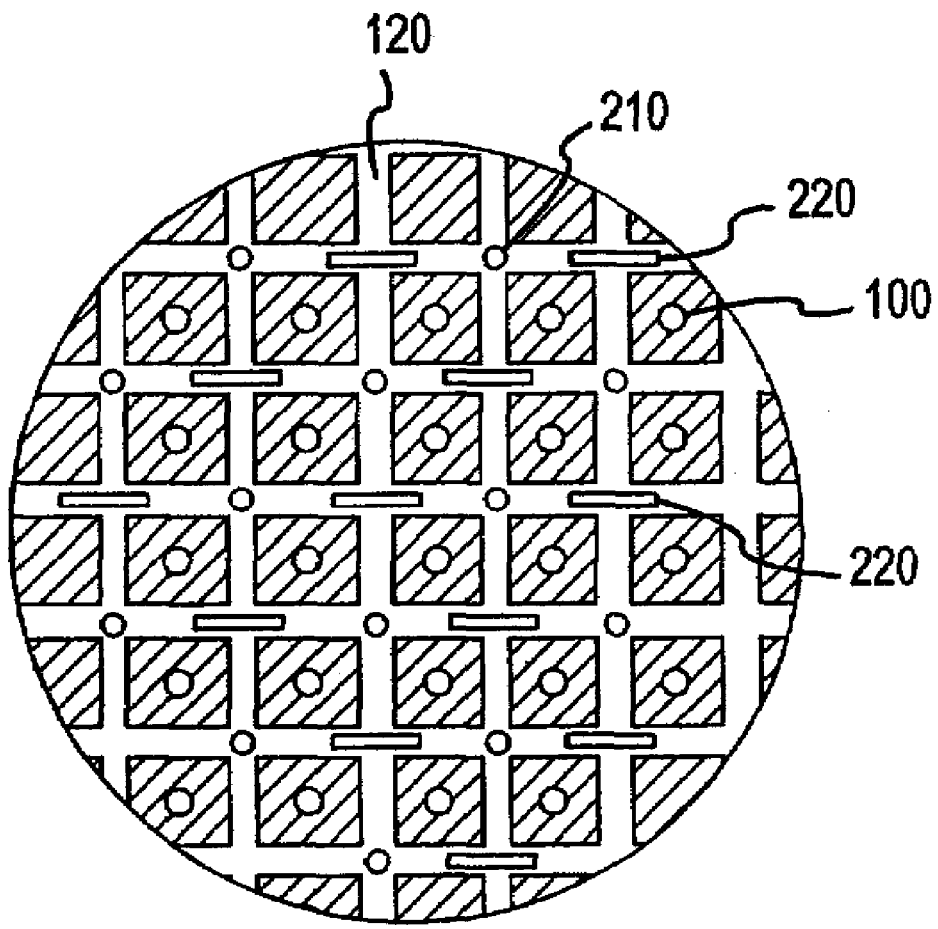
FIG. 9 is a top view of a polishing pad and platen in accordance with another exemplary embodiment of the present invention.

As illustrated in FIGS. 4 and 5, polishing pad 40 may have apertures 210 through which the electrolytic planarizing solution from channels 110 may flow. In addition, polishing pad 40 may have grooves 120. Grooves 120 are configured to effect transportation of the electrolytic planarization solution on polishing pad 40 during planarization. Polishing pad 40 may also be porous, further facilitating transportation of the electrolytic planarization solution. Apertures 210 may also be configured to expose portions of platen 50 which acts as a cathode when an electric potential is applied between the metallized surface 80 of wafer 60 and platen 50. Because polishing pad 40 is formed of insulative material, apertures 210 act to direct the electric field from platen 50 (cathode) to the metallized surface 80 (anode) of wafer 60. In an alternative embodiment, as illustrated in FIG. 9, polishing pad may have cut-out portions, or "windows" 220, preferably positioned within grooves 120, which expose portions of platen 50 to facilitate an electric potential difference between platen 50 and the metallized surface of wafer 80. It will be appreciated, however, that polishing pad 40 may have any suitably-shaped openings that are configured to produce a uniform electric field at desired areas of the wafer.

Referring again to FIG. 4, at least one electrical conductor 70 is positioned within platen 50. While FIG. 4 shows a plurality of electrical conductors 70 positioned within platen 50, it will be appreciated that one, two or any suitable number of electrical conductors 70 may be positioned within platen 50. Electrical conductors 70 are connected at a first end to a power source 90 and are insulated within platen 50 by insulation elements 230. Each of the electrical conductors 70 may include at a second end a contact element 100. At least a portion of contact element 100 is positioned within polishing pad 40. A top surface 100a of contact element 100 may be positioned above or below top surface 40a of polishing pad 40 but is preferably positioned flush with the top surface 40a of polishing pad 40. Contact element 100 is formed of any suitable material that exhibits low electrical resistance and resistance to corrosion and is softer than the metal that comprises the metallized surface 80 of wafer 60. For example, if the metallized surface 80 of wafer 60 is formed of copper, contact element 100 may be formed of a conductively-enhanced polymer material, ceramic material or inorganic fibers such as, for example, carbon fibers.

An electric potential difference is effected between platen 50 and the metallized surface 80 of wafer 60 via electrical conductors 70. Power source 90 applies a negative charge to platen 50 and applies a positive charge to electrical conductors 70. The positive charge is conducted through electrical conductors 70, through contact elements 100 and the electolytic planarizing solution and then to metallized surface 80 of wafer 60. Positioning of the electrical conductors within the platen facilitates creation of a uniform electric potential gradient across the surface of the wafer, reducing the likelihood that edge effects and the like may result. The distance between the metallized surface 80 of wafer 60 and platen 50 is an important factor in the selectivity of the etching process. The distance may be less than 3 mm but is preferably less than 1 mm and is more preferably less than 2000 angstroms. However, to avoid shorting of the circuit formed from platen 50 through the electolytic planarizing solution to metallized surface 80, the platen should not contact the metallized surface.

The apparatus of the present invention may also include a temperature control mechanism. The temperature of the metallized surface 80 of wafer 60 during electrochemical planarization may have a significant effect on the uniformity of the metal removal rate. If the temperature is too high in a given area, electric current may concentrate in that area, causing localized hot spots where metal ion dissolution is occurring at a faster rate than surrounding lower-temperature areas. To counteract the generation of localized hot spots, in one embodiment of the present invention the electrolytic planarizing solution may be cooled before being delivered to the surface 40a of polishing pad 40. In this embodiment, the electrolytic planarizing solution may be subjected to a chiller (not shown) before being delivered to the platen 50.

In an alternative embodiment of the invention, the temperature of the electrochemical planarization process may be controlled by providing a heat exchange fluid to the backside of wafer 60. Apparatus for exposing a heat exchange fluid to the backside of a wafer are well known in the art. For an example of an apparatus configured to regulate the polishing rate of a wafer by backside heat exchange, see U.S. Pat. No. 5,605,488, issued to Ohashi et al. on Feb. 25, 1997, which patent is herein incorporated by reference.

Figure 10:
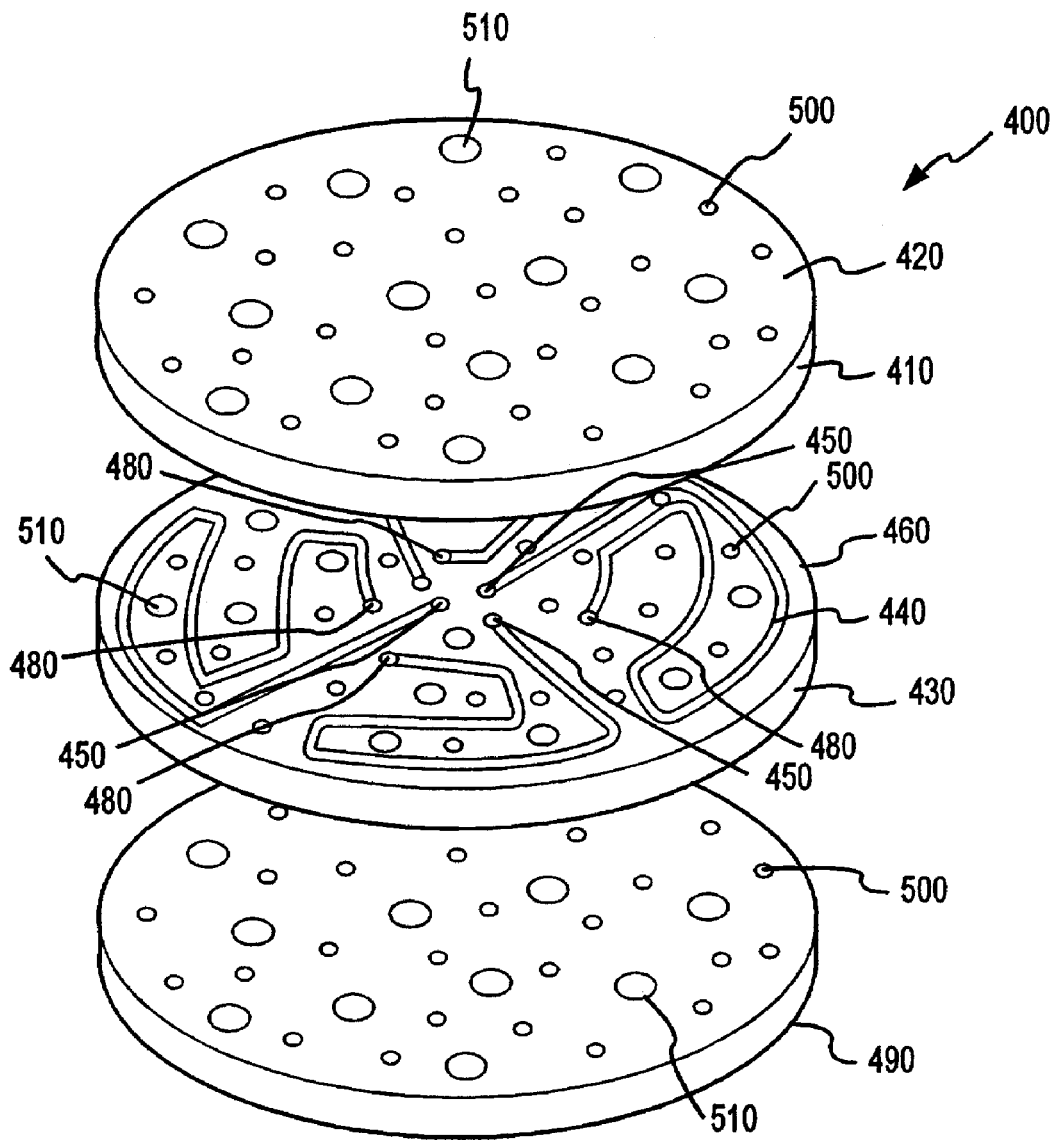
FIG. 10 is an exploded perspective view of a platen in accordance with another exemplary embodiment of the present invention.

The temperature of the electrochemical planarization process may also be regulated by providing a heat conductivity platen configured to be temperature controlled by a heat exchange fluid circulating therethrough. Although there are a number of methods to fabricate such a platen, only one of those methods is illustrated herein. Referring to FIG. 10, in accordance with one embodiment of the invention, platen 400 is fabricated from a material having a high thermal conduction coefficient to facilitate control of the processing temperature. Platen 400 may be constructed in three pieces that are connected together by belts, rivets or, preferably, by brazing to form a unitary platen. Platen 400, in this embodiment, is formed from a substantially circular cover plate 410 that has a substantially planar upper surface 420 to which a polishing pad can be attached, for example, with an adhesive. In this embodiment, platen 400 further includes a channel section 430 that includes channel grooves 440. Preferably, channel grooves 440 are configured in a serpentine pattern. A heat exchange fluid flows from inlets 450 near the center or axis of platen 400 to a location near the periphery 460 of the platen and then, in a serpentine pattern to exits 480 again located near the center or axis of platen 400. Platen 400 is completed by a bottom section 490 that includes on its bottom surface (not show) a configuration for the attachment of the platen to a platen shaft.

In an alternative method (not illustrated) for fabricating platen 400, the channel groove could be formed in the underside of the cover plate. The channel groove could then be sealed by attaching a circular disk having a planar top surface to the underside of the cover plate. The bottom section could then be attached to the circular disk, or, alternatively, the function of the circular disk and the bottom section could be combined. In either this method or the illustrated method, a channel groove through which a heat exchange fluid can be circulated is formed beneath the substantially planar surface of the platen assembly.

Cover plate 410, channel section 430 and bottom section 490 each have a first set of channels 500, similar to channels 110 as referenced in FIG. 4, through which an electrolytic planarizing solution may flow. Channels 500 in cover plate 410 are collinear with channels 500 in channel section 430, which in turn are collinear with channels 500 in bottom section 490. A manifold apparatus (not shown) may be connected to bottom section 490 to deliver the electrolytic planarizing solution through channels 500 of the bottom section, channel section and cover plate to the polishing pad.

In addition to channels 500, cover plate 410, channel section 430 and bottom section 490 have bores 510. Bores 510 in cover plate 410 are collinear with bores 510 in channel section 430, which in turn are collinear with bores 510 in bottom section 490. When the cover plate, channel section and bottom section are connected together to form unitary platen 400, electrical conductors 70 may be seated within bores 510.

A method for electrochemical planarization using one embodiment of the invention will now be described. Referring again to FIG. 4, wafer carrier 130 urges wafer 60 against polishing pad 40 such that wafer 60 engages polishing pad 40 at a desired pressure. Preferably, the wafer carrier applies a uniform and constant pressure of approximately 1 psi or less, although it may be appreciated that any suitable pressure which promotes planarization without interfering with the concurrent electrochemical etching process may be used. Alternatively, to further control the rate of metal removal, the wafer carrier may press the wafer against the polishing pad for a predetermined amount of time, subsequently withdraw the wafer from the polishing pad for a predetermined amount of time, and then repeat the pressing/withdrawing pattern a desired number of times. For example, the wafer carrier may "bump" the wafer against the polishing pad for a predetermined number of times to control the removal rate of the metallized surface.

During the planarization process, an electrolytic planarizing solution is delivered to the surface of polishing pad 40 through channels 110 and aperatures 210. An electric potential is also applied to create a circuit between platen 50, the electrolytic planarizing solution and metallized surface 80 of wafer 60. The power source 90 may apply a constant current or voltage to the apparatus or, alternatively, the current or voltage could be modulated to apply different currents or voltages at predetermined times in the process or to modulate between a predetermined current or voltage and no current or no voltage. Wafer carrier 130 and wafer 60 may rotate about an axis 140 while platen 50 and polishing pad 40 move in a rotational, orbital or linear pattern. In addition, wafer carrier 130 and wafer 60 may oscillate relative to polishing pad 40. Adjusting the various conditions of the electrochemical planarization process, such as the electric potential, distance between the electric conductors and the metallized surface, conductivity of the electrolytic planarizing solution, temperature, hydrodynamic conditions, and mechanical integrity of the passivation film, permits suitable control over the uniformity and rate of removal of metal from the metallized surface.

Figure 6:
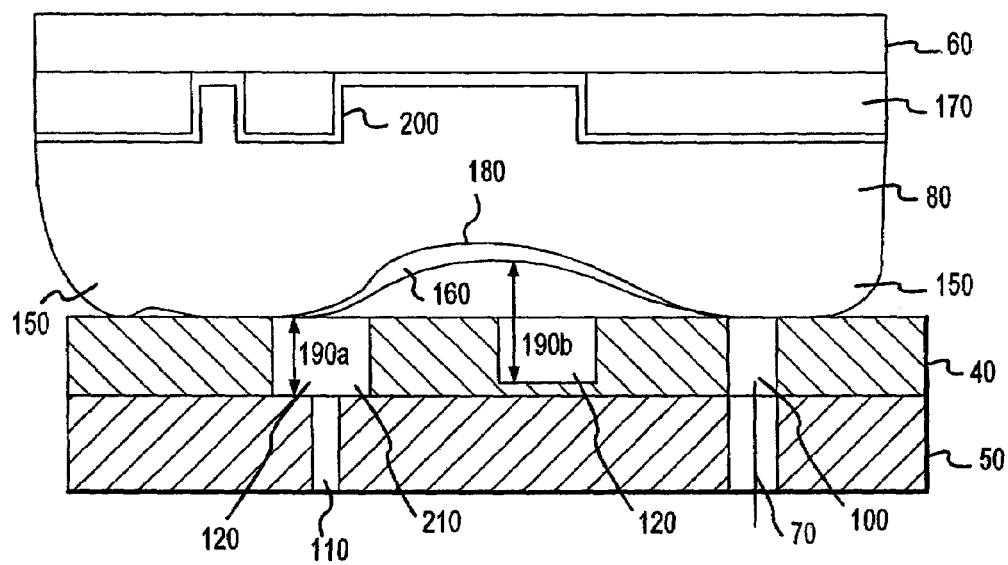
FIG. 6 is a cross-sectional view of a wafer with a metallized surface contacting a polishing pad and contact element in accordance with an exemplary embodiment of the present invention.

FIG. 6 illustrates semiconductor wafer 60 undergoing planarization using the apparatus and method of the present invention. Wafer 60 may have layers 170 of low dielectric constant material or oxide material underlying metallized surface 80. During planarization, electrochemical etching takes place, during which metal ions from metallized surface 80 are liberated from wafer 60. As the high topography areas 150 of the metallized surface 80 of wafer 60 come in contact with the contact elements 100, an electric potential is effected between platen 50, which acts as a cathode, and metallized surface 80 of wafer 60, which acts as an anode. An electrolytic planarizing solution is delivered to the metallized surface 80 of wafer 60 through channels 110 and apertures 210 and is distributed through grooves 120. The film forming agent of the electrolytic planarizing solution forms a soft surface film 160 over the metallized surface 80 of wafer 60. The film forming agent acts to protect the low topography areas 180 of the metallized surface 80 from electrochemical etching until these areas come in contact with contact elements 100, thereby facilitating uniform planarization of wafer 60.

The electric current between the cathode and the anode is inversely proportional to the distance from platen 50 and metallized surface 80 and, accordingly, the thickness of polishing pad 40. A distance 190a from platen 50 to high topography areas 150 is less than a distance 190b from platen 50 to low topography areas 180; consequently, the rate of removal of metal ions from high topography areas 150 is greater than the rate of removal of metal ions from low topography areas 180. In addition, as planarization proceeds, polishing pad 40 performs a "brushing" action on the wafer, thereby effecting mechanical planarization of wafer 60.

Figure 7:
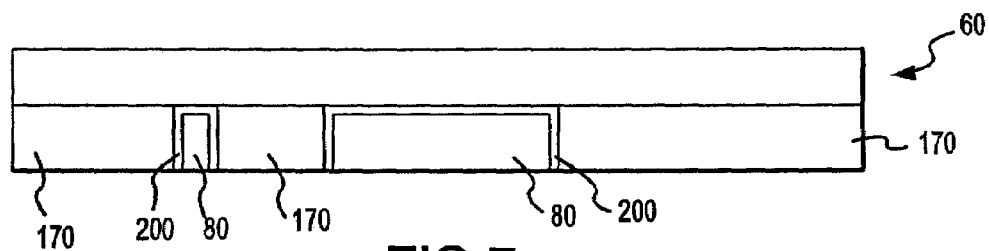
FIG. 7 is a cross-sectional view of a wafer after electrochemical planarization.

As illustrated in FIG. 7, after planarization is completed, any remaining metal from the metallized surface and any remaining barrier layer 200 may be removed by standard etching processes, such as wet etch, vapor etch, spray etch, plasma or even CMP, since the surface of the wafer had just previously been substantially planarized with the present invention. Alternatively, a second electrochemical planarizing solution may be supplied through channels 110 and apertures 210 to the polishing pad. The second electrochemical planarizing solution may have a different composition, for example, different electrolytes, from the first electrochemical planarizing solution so that the second solution is more suitable for electrochemical etching of another metal layer, such as barrier layer 200.

Figure 11:
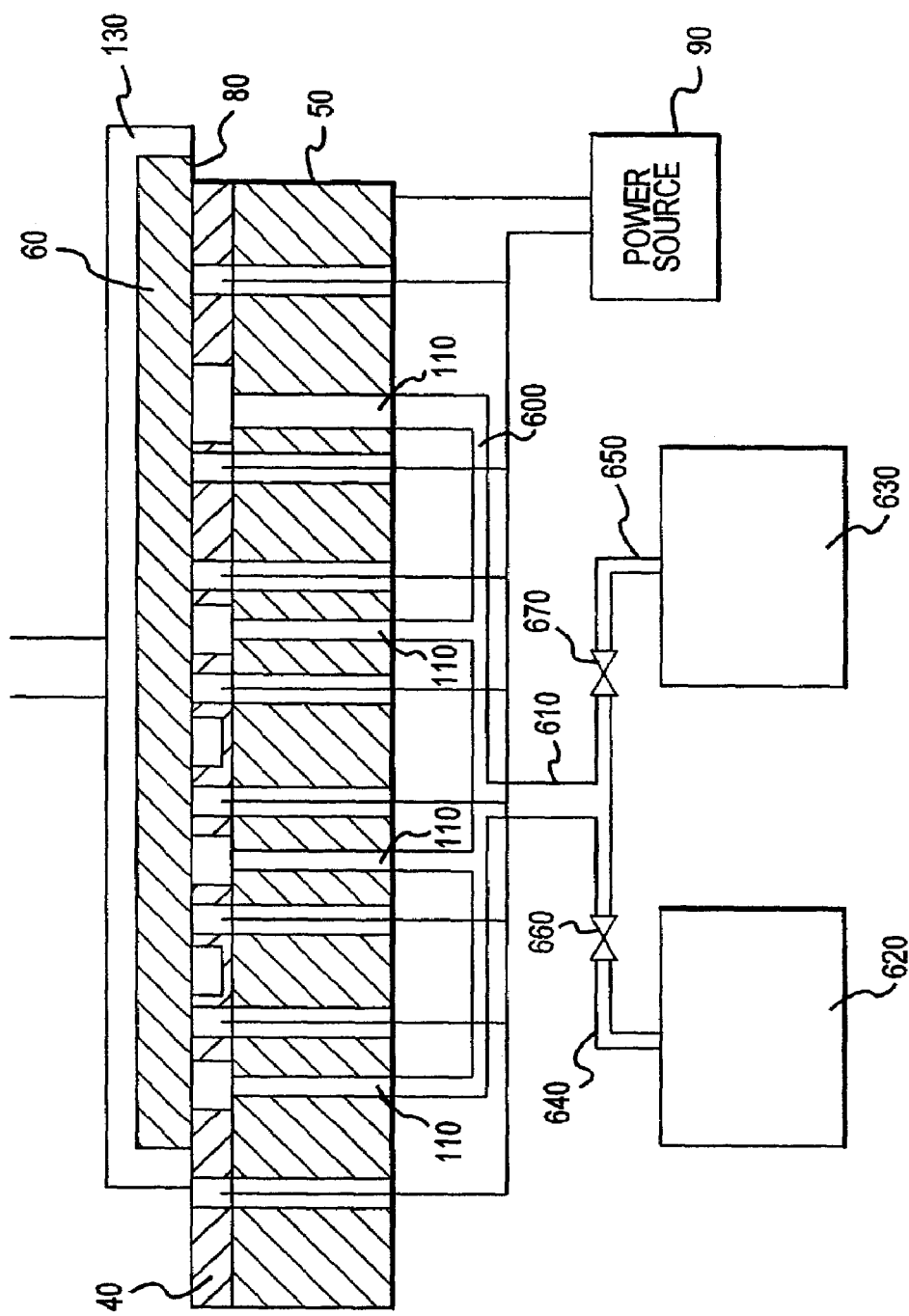
FIG. 11 is a cross-sectional view of another exemplary embodiment of the electrochemical planarization apparatus of the present invention.

In one embodiment of the invention, for example, two or more sources of electrolytic planarizing solution may be connected to the polishing apparatus. Referring to FIG. 11, channels 110 may be connected to a manifold apparatus 600. Manifold apparatus 600 may be connected to a feed tube 610 which is in fluid communication with a first electrolytic planarizing solution source 620 and a second electrolytic planarizing solution source 630 through a first source tube 640 and a second source tube 650, respectively. At the commencement of planarization, a first switch 660 may be opened to allow a first electrolytic planarizing solution from first electrolytic planarizing solution source 620 to flow through first source tube 640, feed tube 610, manifold apparatus 600, and channels 110 to the surface of polishing pad 40. During the flow of the first electrolytic planarizing solution, a second switch 670 is closed to prevent the flow of a second electrolytic planarizing solution from second electrolytic planarizing solution source 630. The first electrolytic planarizing solution may include compounds suitable for uniformly and effectively etching a first metal layer on wafer 60. When the first metal layer has been substantially removed from wafer 60, switch 660 may be closed and switch 670 may be opened to permit the second electrolytic planarizing solution from electrolytic planarizing solution source 630 to flow through second source tube 650, feed tube 610, manifold apparatus 600 and channels 110 to the surface of polishing pad 40. The second electrolytic planarizing solution may include compounds suitable for uniformly and effectively etching a second metal layer, for example, a barrier metal layer, on wafer 60. While the illustrated embodiment of the present invention utilizes two electrolytic planarizing solutions, it will be appreciated that any suitable number of electrolytic planarizing solutions may be used to electrochemically etch the various metal layers of metallized surface 80 of wafer 60.

The ECP apparatus of the present invention facilitates concurrent electrochemical etching and chemical mechanical planarization, such that the metal layer is removed first from high topography areas of the wafer, producing more uniformly planarized wafers. The electrochemical etching aspect of the invention enables high removal rates at low pressures, which reduces dishing and oxide erosion.

Figure 8:
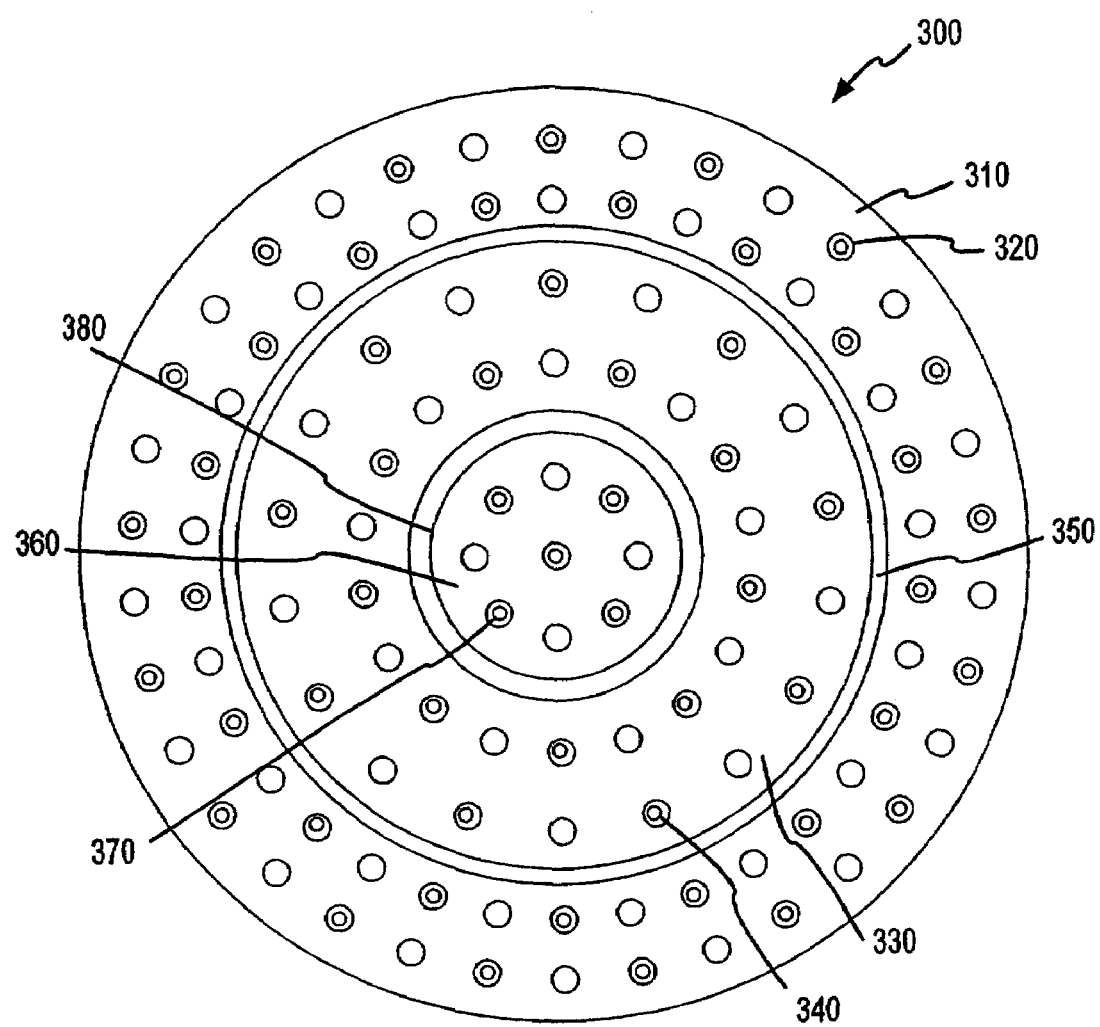
FIG. 8 is a top view of a platen in accordance with an embodiment of the present invention.

FIG. 8 illustrates another alternative embodiment of a platen 300 of the present invention in which a platen 300 may have "zones" of electrical conductors to which different currents are supplied. Because the center of a wafer carrier rotates at a lower velocity at its center than at its periphery, a wafer carried by the wafer carrier may exhibit a faster removal rate of the metallized surface at the periphery of the wafer compared to the center of the wafer. To counteract this non-uniform removal across the surface of the wafer, use of "zones" of electrical conductors supplied with different currents may be used. For example, in a first zone 310 one or more electrical conductors 320 may be connected to a first power supply which supplies a first current. In a second zone 330 one or more electrical conductors 340 may be connected to a second power supply which supplies a second current which is different from the first current. The first zone and the second zone may be separated by a first insulator 350. In addition, platen 300 may have a third zone 360 which has one or more electrical conductors 370 connected to a third power supply which supplies a third current, which may be equivalent to the first current or may be different from both the first and the second currents. The third zone may be separated from the second zone by a second insulator 380. While FIG. 8 shows three zones of electrical conductors to which two or more currents are supplied, it will be appreciated that platen 300 may have four or more zones with electrical conductors to which are supplied any suitable currents. Platen 300 may further have channels 390 through which an electrolytic planarizing solution is supplied. Using this embodiment, the electric potential supplied to different areas of a wafer may be used to reduce edge effects which result when the peripheral edges of the wafer are planarized at a different rate than the center of the wafer.

In another embodiment (not illustrated), the present invention may be configured for endpoint detection. Referring again to FIG. 6, as the metallized surface 80 of wafer 60 is removed during the planarization process, the resistance of the metallized surface 80 increases, thereby increasing the voltage through wafer 60. This change in the electric potential between the metallized surface and the platen may be monitored to determine the desired endpoint of the planarization process. Accordingly, the present invention provides the advantage of in-situ endpoint point detection without requiring an additional dedicated endpoint detection system.

In the foregoing specification, the invention has been described with reference to specific embodiments. However, it may be appreciated that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be constructed as critical, required, or essential features or elements of any or all of the claims. As used herein, the terms "comprises," "comprising" or any other variation thereof, are intended to cover a nonexclusive inclusion, such that a process, method, article, or apparatus that comprises a list of elements does not include only those elements but may include other elements not expressly listed or inherent to such process, method, article or apparatus.

What is claimed is:

1. An apparatus for removing metal from a metallized surface of a workpiece, comprising:
    a polishing pad,
    an electrically conductive surface having more than one zone disposed proximate to said polishing pad wherein the zones are separated by one or more insulators;
    at least one conducting element disposed within each zone of the electrically conductive surface;
    a workpiece carrier configured to press the workpiece against the polishing pad; and
    a plurality of power sources each having a first positive output connected to the conducting element and a second negative output connected to the electrically conductive surface contained within each of the zones of the conductive surface.

2. The apparatus of claim 1 wherein said at least one conducting element is positioned flush with a top surface of said polishing pad.

3. The apparatus of claim 1 wherein said at least one conducting element is positioned above a top surface of said polishing pad.

4. The apparatus of claim 1 wherein said at least one conducting element is positioned below a top surface of said polishing pad.

5. The apparatus of claim 1 wherein said conducting elements are positioned within the electrically conductive surface such that a uniform electric potential gradient is created across each zone of the metallized surface of the wafer.

6. The apparatus of claim 1 wherein said at least one conducting element is comprised of a material that exhibits low electrical resistance and resistance to corrosion.

7. The apparatus of claim 1 wherein the distance between the metallized surface of the workpiece and the electrically conductive surface is less than 3 mm.

8. The apparatus of claim 7 wherein the distance between the metallized surface of the workpiece and the electrically conductive surface is less than 1 mm.

9. The apparatus of claim 8 wherein the distance between the metallized surface of the workpiece and the electrically conductive surface is less than 200 angstroms.

10. The apparatus of claim 1 wherein the metallized surface of the workpiece does not contact the electrically conductive surface during removal of the metal from the metallized surface of the workpiece.

* * * * *